US006677183B2

(12) United States Patent
Sakaguchi et al.

(10) Patent No.: US 6,677,183 B2
(45) Date of Patent: Jan. 13, 2004

(54) METHOD OF SEPARATION OF SEMICONDUCTOR DEVICE (75) Inventors: Kiyofumi Sakaguchi, Kanagawa (JP); Takao Yonehara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/059,116

(22) Filed: Jan. 31, 2002

(65) Prior Publication Data
US 2002/0102777 A1 Aug. 1, 2002

(30) Foreign Application Priority Data
Jan. 31, 2001 (JP) ........................ 2001-023848

(51) Int. Cl.$^7$ .................... H01L 21/44; H01L 21/48; H01L 21/50
(52) U.S. Cl. ........................ 438/113; 257/620
(58) Field of Search .................. 438/460–465, 438/113–114; 257/620

(56) References Cited

U.S. PATENT DOCUMENTS

| 5,206,749 A | 4/1993 | Zavracky et al. ............ 359/59 |
| 5,256,562 A | 10/1993 | Vu et al. ..................... 437/86 |
| 5,811,348 A | 9/1998 | Matsushita et al. ......... 438/455 |
| 5,856,229 A | 1/1999 | Sauaguchi et al. .......... 438/406 |
| 5,985,742 A | 11/1999 | Henley et al. .............. 438/515 |
| 6,075,280 A * | 6/2000 | Yung et al. ................. 257/620 |
| 6,107,213 A | 8/2000 | Tayanaka ..................... 438/762 |
| 6,136,668 A * | 10/2000 | Tamaki et al. .............. 438/462 |
| 6,186,384 B1 * | 2/2001 | Sawada ......................... 225/2 |
| 6,190,937 B1 | 2/2001 | Nakagawa et al. ........... 438/67 |
| 6,222,513 B1 | 4/2001 | Howard et al. ............... 345/84 |
| 6,258,698 B1 | 7/2001 | Iwasaki et al. .............. 438/455 |
| 6,306,729 B1 | 10/2001 | Sakaguchi et al. .......... 438/458 |
| 6,331,208 B1 | 12/2001 | Nishida et al. ................ 117/89 |
| 6,342,433 B1 | 1/2002 | Ohmi et al. ................. 438/455 |
| 6,382,292 B1 | 5/2002 | Ohmi et al. ................. 156/584 |
| 6,465,329 B1 * | 10/2002 | Glenn ........................ 438/462 |
| 2002/0076904 A1 * | 6/2002 | Imler ......................... 438/462 |
| 2002/0100941 A1 * | 8/2002 | Yonehara et al. ............. 257/98 |

FOREIGN PATENT DOCUMENTS

| EP | 849 788 | 6/1998 |
| EP | 858 110 | 8/1998 |
| EP | 886 300 | 12/1998 |
| EP | 1 122 794 | 8/2001 |
| JP | 9-312349 | 12/1997 |
| JP | 11-316397 | 11/1999 |

OTHER PUBLICATIONS

Shimoda, T., et al: "Surface Free Technology By Laser Annealing (SUFTLA)" International Electron Devices Meeting 1999. IEDM. Technical Digest. Washington, DC, Dec. 5–8, 1999, New York, NY: IEEE, US, Aug. 1, 1999, pp. 289–292, XP000933199 ISBN: 0–7803–5411–7.

* cited by examiner

*Primary Examiner*—Long Pham
*Assistant Examiner*—Thao X Le
(74) *Attorney, Agent, or Firm*—Fitzpatrick, Cella, Harper & Scinto (57) ABSTRACT This invention provides a method of manufacturing a thin-film semiconductor device by a smaller number of processes with reduced influence on a device formation layer at the time of separation. This manufacturing method includes the step of preparing a member having, on a separation layer, a semiconductor film having a semiconductor element and/or semiconductor integrated circuit, the step of forming kerfs from the semiconductor film side of the member, and the separation step of, after the kerf formation step, separating a desired region of the semiconductor element and/or semiconductor integrated circuit from the member.

19 Claims, 4 Drawing Sheets

METHOD OF SEPARATION OF SEMICONDUCTOR DEVICE

FIELD OF THE INVENTION

The present invention relates to a thin-film semiconductor device and a method of manufacturing the same.

BACKGROUND OF THE INVENTION

For a thin LSI chip, a technique of forming an integrated circuit and the like on a silicon substrate and then thinning the resultant structure from the lower surface side of the substrate using a grinder is known.

However, the integrated circuit and the like are formed only on the upper surface of the silicon substrate. Most parts are ground and wasted. Such a technique does not allow effectively using limited resources.

On the other hand, along with micropatterning and an increase in degree of integration of semiconductor devices, the chip heat density may greatly increase. Hence, there is an urgent need of establishing a technique for thin LSI chips.

A normal semiconductor chip itself has no flexibility. If it is to be mounted on a thin device such as an IC card, the bending strength must be increased. This is because a portable device such as an IC card may receive a bending force when it is accommodated. Hence, an LSI chip and the like which are mounted on a thin device must be thin from the viewpoint of heat dissipation and mechanical flexibility.

Japanese Patent Laid-Open No. 9-312349 describes a technique for a flexible LSI chip using separation by a porous layer.

Figure 4A:
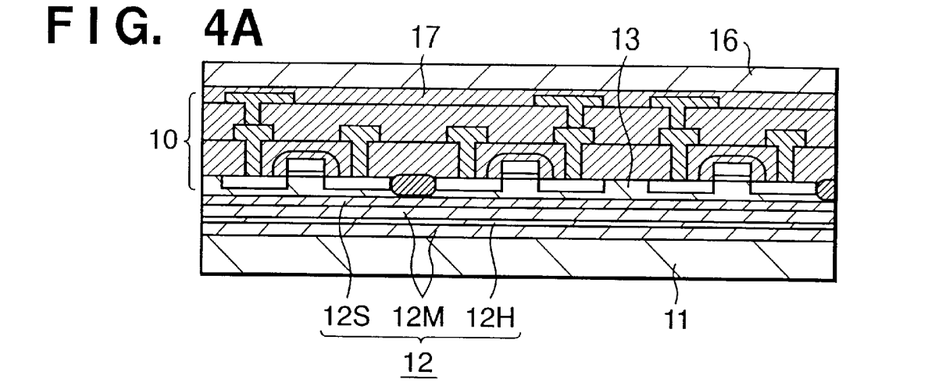
FIGS. 4A to 4C are schematic sectional views for explaining a prior art.
Figure 4B:
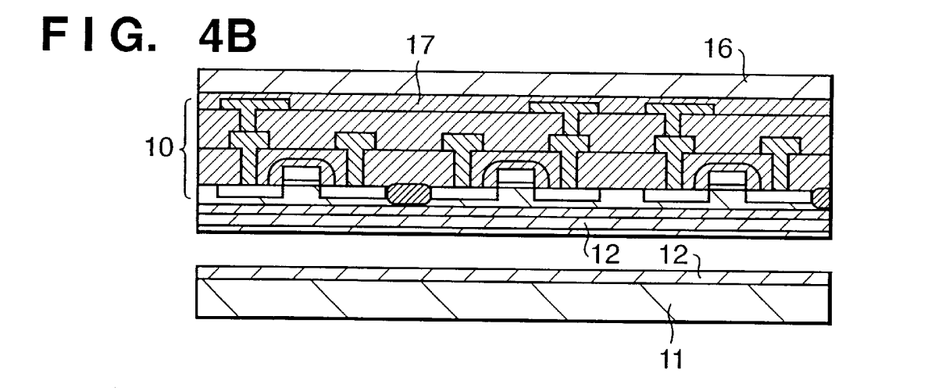

More specifically, as shown in FIG. 4A, a device formation layer 10 is formed on a semiconductor substrate 11 via a porous layer 12. The device formation layer and holding substrate 16 are bonded via an adhesive 17. After that, an external force in a direction in which the semiconductor substrate 11 and holding substrate 16 are separated from each other is applied between the semiconductor substrate 11 and the holding substrate 16. Then, separation occurs at the mechanically weak porous layer 12, and the device formation layer 10 separates from the semiconductor substrate 11 together with the holding substrate 16 (FIG. 4B).

Figure 4C:
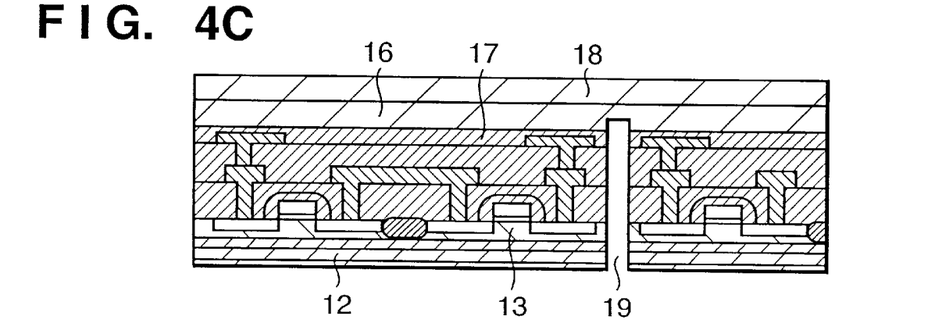

Next, a dicing film 18 that stretches when pulled in the planar direction is jointed to the rigid holding substrate 16 side. Dicing is performed using a dicing apparatus to form a kerf 19 from the device formation layer side (FIG. 4C). After that, the dicing film is stretched in the planar direction to separate chips. Thus, thin LSI chips are completed.

However, the above thin LSI chip forming technique requires a plurality of processes such as the bonding process to the holding substrate and the joint process to the dicing film.

In addition, when all the device formation layers are connected in separation, some of the device formation layers may be locally distorted to make adverse influence on the device characteristics.

SUMMARY OF THE INVENTION

The present invention has been made in consideration or the above problems, and has as its object to provide a thin-film semiconductor device which is formed by a smaller number of processes with reduced influence on a device formation layer at the time of separation, a method of manufacturing the thin-film semiconductor device, and a thin-film semiconductor device that can be formed by the method.

It is another object of the present invention to provide an economical thin-film semiconductor device manufacturing method which can use a member, that was used to manufacture a thin-film semiconductor device once, to manufacture a semiconductor device again.

According to an aspect of the present invention, there is provided a method of manufacturing a thin-film semiconductor device, comprising the step of preparing a member having, on a separation layer, a semiconductor film having a semiconductor element and/or semiconductor integrated circuit, the step of forming kerfs from the semiconductor film side of the member, and the separation step of, after the kerf formation step, separating a desired region of the semiconductor element and/or semiconductor integrated circuit from the member.

Especially, the separation step can be performed by injecting a fluid into the kerfs.

The member is obtained by forming a porous layer on a surface of a semiconductor substrate, forming the semiconductor film on a surface of the porous layer, and then forming the semiconductor element and/or semiconductor integrated circuit, or by forming the semiconductor element and/or semiconductor integrated circuit on a surface of a semiconductor substrate and implanting ions from the surface side to a predetermined depth to form the separation layer.

The kerfs may be formed in the semiconductor film, or may be formed in a region formed in a process of forming the semiconductor element and/or semiconductor integrated circuit on the semiconductor film.

The kerfs can be formed such that bottom portions thereof are located in the separation layer or at an interface between the semiconductor film and the separation layer. Also, when the member has the separation layer and semiconductor film on a semiconductor region, the kerfs may be formed such that bottom portions thereof are located at an interface between the separation layer and the semiconductor region or in the semiconductor region.

The separation step is performed by injecting a high-pressure fluid from the kerfs, or by injecting the fluid comprising a liquid or a gas to at least some of the kerfs. The separation step may be performed under a static pressure. The desired region can be formed into a plurality of chips by the separation step.

The member may be formed again using a remaining member that is left after the desired region is separated from the member.

According to the present invention, there is also provided a thin-film semiconductor device obtained by processing a member having, on a separation layer, a semiconductor film having a semiconductor element and/or semiconductor integrated circuit, wherein the process comprises the kerf formation step of forming kerfs from the semiconductor film side of the member, and the separation step of, after the kerf formation step, separating a desired region of the semiconductor element and/or semiconductor integrated circuit from the member.

According to another aspect of the present invention, there is provided a method of manufacturing a semiconductor device, comprising preparing a member which has a separation layer on a base and a semiconductor film having a plurality of chip regions on the separation layer, forming kerfs in the semiconductor film to partition the plurality of chip regions, and forming cracks in the separation layer to separate each of the partitioned chip regions from the base.

According to still another aspect of the present invention, there is provided a semiconductor device obtained by processing a member having a separation layer on a base and a plurality of chip regions on the separation layer, wherein the process comprises forming kerfs in the semiconductor film to partition the plurality of chip regions, and forming cracks in the separation layer to separate each of the partitioned chip regions from the base.

In a preferred embodiment of the present invention, for example, kerfs are formed before a device layer having a semiconductor element or semiconductor integrated circuit element is separated from a member. After that, a desired region is separated from the member using a fluid or the like. Hence, a thin-film semiconductor device can be manufactured at high efficiency without any influence on the device layer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

The main embodiment of the present invention will be described with reference to FIGS. 1A to 1F.

Figure 1A:
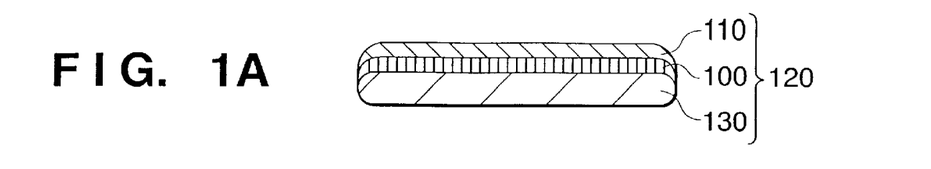
FIGS. 1A to 1F are schematic sectional views showing an embodiment of the present invention.
Figure 1B:
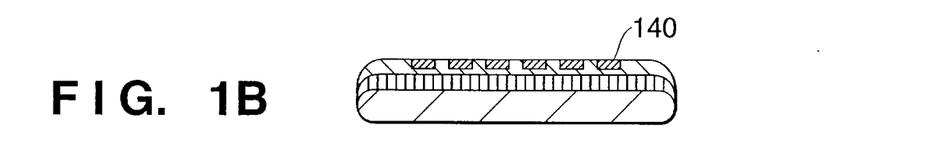

First, as shown in FIG. 1A, a member 120 having a semiconductor film 110 on a semiconductor region (base) 130 via a separation layer 100 is prepared. Semiconductor elements and/or semiconductor integrated circuits 140 are formed on the semiconductor film 110 (FIG. 1B). Before the semiconductor elements and/or semiconductor integrated circuits 140 are separated into chips, kerfs 150 are formed at desired positions from the side of the semiconductor film 110.

Figure 1C:
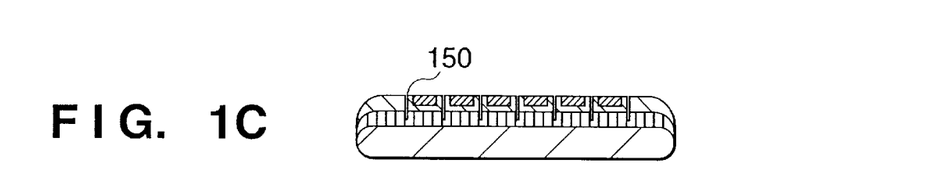

After that, desired semiconductor elements and/or semiconductor integrated circuits 140 are separated using the separation layer 100. In the separation process, for example, a fluid is injected into at least some of the kerfs 150 to make cracks in the planar direction in the separation layer 100, thereby separating chips from the semiconductor region (base) 130. Alternatively, a desired region to be separated is held by a vacuum chuck or the like, and then, an ultrasonic vibration is applied to that region to separate it at the separation layer. Instead, heat is locally applied to a desired region to separate it.

Figure 1D:
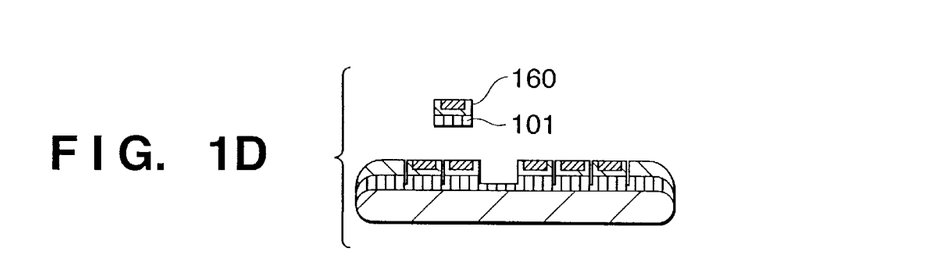

Thus, one or a plurality of thin-film semiconductor devices 160 are obtained as chips (FIG. 1D).

Figure 1E:
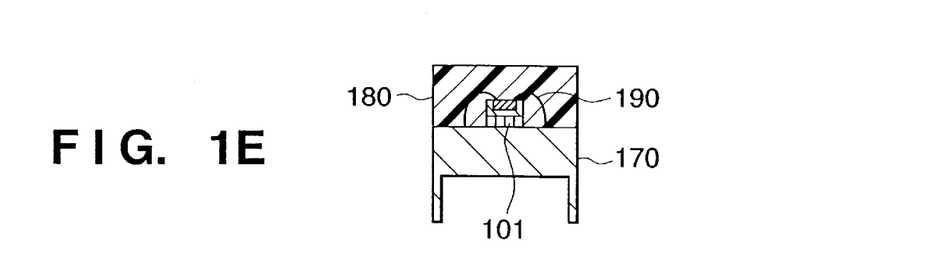
Figure 1F:
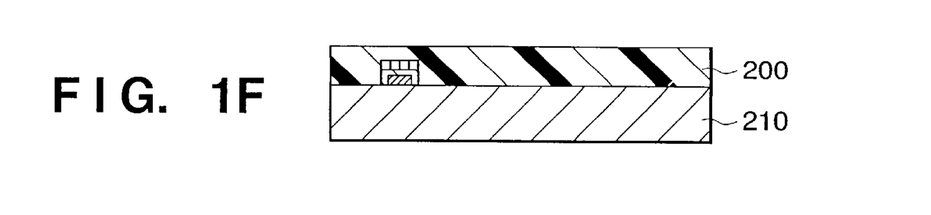

If the separation layer 100 partially remains on the thin-film semiconductor device 160, the remaining portion can be removed by polishing, grinding, or etching. After that, the thin film semiconductor device 160 can be connected to another circuit or packaged. Alternatively, the thin film semiconductor device 160 can be packaged with the remaining separation layer. That is, the thin-film semiconductor device 160 can be mounted on a support substrate 170 via the remaining separation layer 101, as shown in FIG. 1E, or can be transferred onto a plastic card, as shown in FIG. 1F. Reference numeral 180 denotes a sealing resin; 190, a wire; 200, a sealing resin/film; and 210, a plastic card. Since the separation layer serves as a gettering site, the resistance against metal contamination during the processes increases.

(Separation Layer)

More specifically, the separation layer 100 is a porous silicon layer formed by anodizing the surface of a single-crystal silicon wafer or an ion-implanted layer formed by implanting hydrogen ions, helium ions, or rare gas ions to a desired depth of a single-crystal silicon wafer.

Figure 2A:
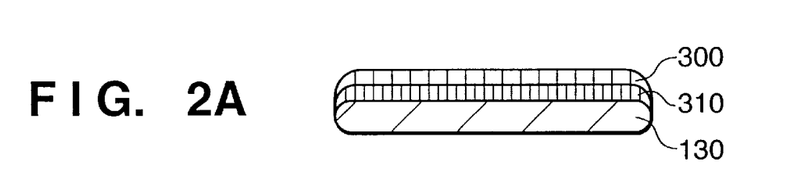
FIGS. 2A and 2B are schematic sectional views showing examples of the structure of a separation layer in the present invention.
Figure 2B:
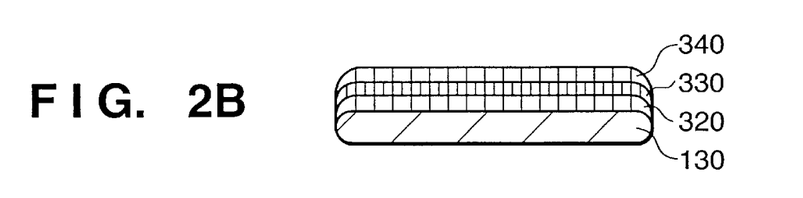

In the former case, to form the member 120, a non-porous thin film such as a single-crystal silicon film is grown on the porous silicon layer by CVD or the like. The separation layer 100 may be formed from a plurality of layers having different porosities. For example, as shown in FIG. 2A, a two-layered structure including a high-porosity layer 310 and low-porosity layer 300 from the semiconductor region 130 side may be formed. Alternatively, a three-layered structure including a low-porosity layer 320, high-porosity layer 330, and low-porosity layer 340 from the semiconductor region 130 side may be formed. The porosity of a high-porosity layer can be 10% to 90%. The porosity of a low-porosity layer can be 0% to 70%. To form a plurality of layers having different porosities, the current density in anodizing is changed, or the type or concentration of an anodizing solution is changed.

When a porous layer is formed by anodizing, a protective film forming process of forming a protective film such as a nitride film or oxide film on the inner walls of pores in the porous layer or an annealing process in an atmosphere containing hydrogen is preferably performed before growing the semiconductor film 110 on the porous layer. It is also preferable to execute the annealing process after the protective film forming process.

When the semiconductor film 110 is to be grown by CVD, the semiconductor film 110 is preferably slowly grown at 20 nm/min or less to a predetermined thickness (e.g., 10 nm).

(Semiconductor Film)

As the semiconductor film 110, a non-porous single-crystal silicon thin film or a compound semiconductor film such as a GaAs, InP, or GaN film can be used. When the semiconductor film is made of single-crystal silicon, $SiH_2Cl_2$, $SiHCl_3$, $SiCl_4$, $SiH_4$, or HCl gas may be added as a source gas. The forming method is not limited to CVD, and MBE or sputtering can also be used.

After the porous layer is subjected to first annealing in an atmosphere containing hydrogen, second annealing is preferably executed at a temperature higher than that for the first annealing before the thin film is grown. The first annealing temperature can be 800° C. to 1,000° C., and the second annealing temperature can be 900° C. to melting point. With this process, pores on the surface of the porous layer can be sufficiently sealed. For example, the first annealing may be executed at 950° C., and the second annealing may be executed at 1,100° C.

(Member)

As the member 120, not only a single-crystal silicon wafer prepared by the CZ method, MCZ method, or FZ method but also a wafer having a substrate surface annealed in hydrogen or epitaxial silicon wafer can also be used. Not only silicon but also a compound semiconductor substrate such as a GaAs substrate or InP substrate can be used.

(Semiconductor Element and/or Semiconductor Integrated Circuit)

As the semiconductor element and/or semiconductor integrated circuit 140, an element such as a CMOS, bipolar transistor, diode, coil, or capacitor, or a semiconductor integrated circuit such as a DRAM, microprocessor, logic IC, or memory can be formed. The application purposes of the element or circuit include an electronic circuit, oscillation circuit, light receiving/emitting element, optical waveguide, and various sensors.

(Kerf)

To form the kerfs 150, a normal dicing apparatus can be used. Alternatively, etching, laser abrasion, ultrasonic cutter, or high-pressure jet (e.g., water jet) can be used. For etching, $HF+H_2O_2$, $HF+HNO_3$, or an alkali solution can be used as an etchant. Examples of the laser are a YAG laser, $CO_2$ laser, and excimer laser.

The bottom surface of a kerf may reach the semiconductor region 130. However, it preferably reaches the interior of the separation layer 100 or a portion near the interface between the semiconductor film 110 and the separation layer 100. When the separation layer includes high- and low-porosity layers, the bottom surface of a kerf preferably reaches the interior of the high-porosity layer or a portion near the interface between the high- and low-porosity layers.

Before kerf formation, portions between the prospective separated chips may be subjected to LOCOS (local oxidation) or mesa etching to remove the semiconductor film between the chips.

(Separation)

Separation can be executed by injecting a fluid such as a liquid or gas into at least some of the kerfs 150 that surround a portion to be separated, i.e.,. a desired one of a plurality of chip portions. Fluid injection here includes injecting high-pressure fluid jet and separation under a static pressure. When a fluid is injected to kerfs around each chip, each desired chip can be separated. Under a static pressure, a plurality of chips can be simultaneously separated altogether. In this case, the chips are preferably bonded to a support member for supporting the chips. An ultrasonic wave may be applied to a fluid. As a fluid, a liquid such as water, etchant, or alcohol or a gas such as air, nitrogen gas, or argon gas can be used.

An example in which chips are separated by injecting a fluid to kerfs will be described in detail. Separation using two nozzles will be described. However, the separation method is not limited to the following method if chips can be separated by controlling the fluid pressure or the like.

Figure 3A:
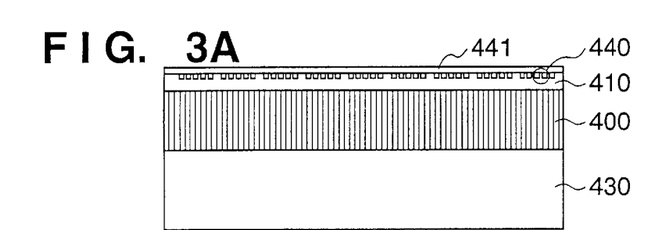
FIGS. 3A to 3F are schematic sectional views showing a separation process in the present invention.
Figure 3B:
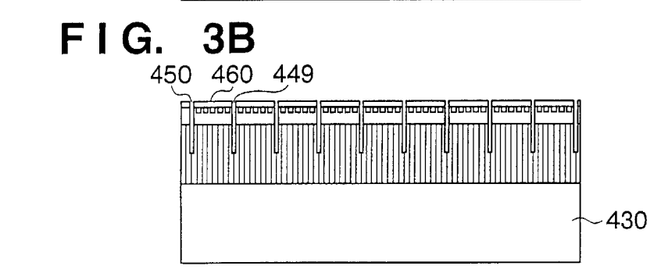
Figure 3C:
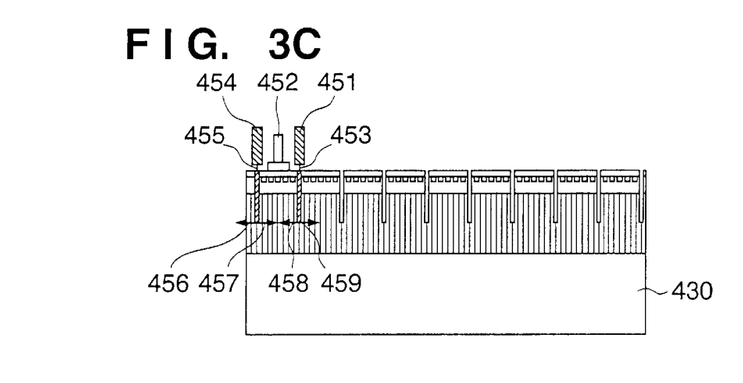
Figure 3D:
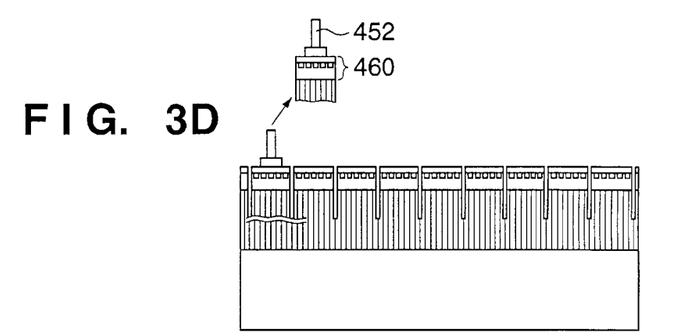
Figure 3E:
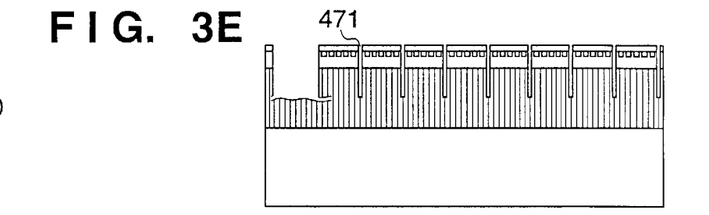
Figure 3F:
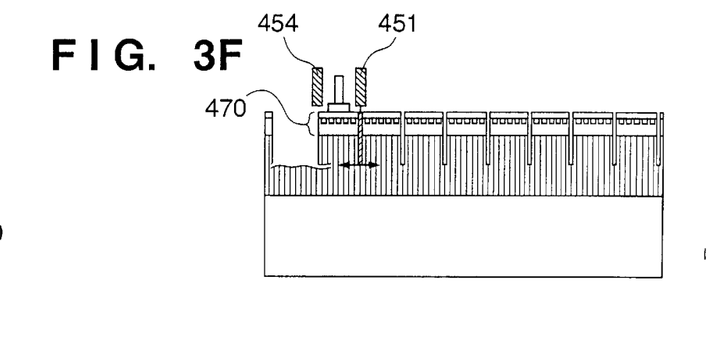

FIG. 3A shows a case wherein a semiconductor film 410 is formed on a semiconductor region 430 via a porous layer 400 serving as a separation layer, and semiconductor elements or semiconductor integrated circuits 440 are formed on the semiconductor film. Reference numeral 441 denotes an insulating cap layer. Kerfs 450 are formed as shown in FIG. 3B. Referring to FIG. 3B, the bottom surfaces of kerfs 449 and 450 are located in the porous layer. To separate a chip 460 from the semiconductor region 430, fluids 453 and 455 are injected from nozzles 451 and 454 to the kerfs while holding the chip 460 by a chip holding tool 452. The fluids reach the bottom surfaces of the kerfs and then flow in the lateral direction (reference numerals 456 to 459 schematically indicate flows of the fluids). When fluids 457 and 458 that have entered from the kerfs 449 and 450 communicate, the chip 460 separates from the semiconductor region 430 (FIG. 3D). If the porosity is to be changed in the porous layer, the separation layer is preferably formed such that the porosity changes near the bottom surface portion of each kerf to facilitate separation. When the chip holding tool 452 that is holding the chip is separated from the semiconductor region 430, the chip is separated from the semiconductor region 430 (FIG. 3E). To separate a chip 470, it may be separated only by injecting the fluid only from the nozzle 451 without injecting the fluid from the nozzle 454 (FIG. 3F).

As the chip holding tool 452, for example, a vacuum chuck may be used. Alternatively, a mechanism which inserts thin members into kerfs to sandwich the chip by the thin members, or any other appropriate mechanism can be used. When a chip to be separated is held by a vacuum chuck or the like, and then, a fluid is injected to the kerf while applying an ultrasonic vibration to the chip, the fluid may be injected to two opposing kerfs of four kerfs that surround the chip or to one of the corner portions of the chip.

Also, a desired one of small regions partitioned by forming kerfs may be held by a vacuum chuck or the like, and then, an ultrasonic vibration may be applied to that region or heat may be locally applied to separate the region. Especially when the separation layer is formed by implanting hydrogen ions, nitrogen ions, He ions, or rare gas ions, and the resultant structure is annealed at about 400° C. to 600° C., a microcavity layer formed by ion implantation coagulates. A chip may be separated using this phenomenon. The structure may be heated by a $CO_2$ laser or the like. Alternatively, since the region is partitioned into small regions by kerfs, a desired region may be separated by applying a tensile force, compression force, or shearing force while keeping the region by a vacuum chuck or the like. When the region is partitioned into small regions before separation, unnecessary stress concentration can be prevented even in separation using an external force. The size of a small region is preferably 10 cm×10 cm or less, more preferably, 5 cm×5 cm or less, and more preferably 2 cm×2 cm or less.

EXAMPLE 1

A p-type single-crystal Si substrate having a resistivity of 0.01 Ω.cm was prepared. The substrate surface was anodized in an HF solution. The anodizing conditions were Current density: 7 ($mA.cm^{-2}$)

Anodizing solution:$HF:H_2O:C_2H_5OH=1:1:1$

Time: 11 (min)

Thickness of porous Si layer: 12 ($\mu$m)

The porosity of the porous Si layer was adjusted such that a high-quality epitaxial Si layer could be formed on the porous Si layer and the porous Si layer could be used as a separation layer. More specifically, the porosity was 20%. The thickness of the porous Si layer is not limited to the above thickness and may be several hundred $\mu$m to 0.1 $\mu$m. The type of the single-crystal Si substrate is not limited to the p type and may be n type. The resistivity of the substrate is not limited to the particular value. The substrate typically has a resistivity ranges from 0.001 to 50 Ω.cm, preferably from 0.005 to 1 Ω.cm, and more preferably from 0.005 to 0.1 Ω.cm.

This single-crystal Si substrate was oxidized in an oxygen atmosphere at 400° C. for 1 hr. The inner walls of pores in the porous Si layer were covered with a thermal oxide film.

After that, the surface of the porous Si layer was dipped in hydrofluoric acid to remove only the oxide film on the surface of the porous Si layer while leaving the oxide film on the inner walls of the pores. Next, a 3-$\mu$m thick single-crystal Si layer was epitaxially grown on the porous Si layer by CVD (Chemical Vapor Deposition). The growth conditions were Source gas: $SiH_2Cl_2/H_2$
Gas flow rate: 0.5/180 l/min
Gas pressure: 80 Torr
Temperature: 950° C.
Growth rate: 0.3 $\mu$m/min The single-crystal Si layer may be grown on the porous Si layer to have a thickness ranges from several nm to several hundred $\mu$m in accordance with applications or devices to be manufactured.

Before the epitaxial growth, annealing was executed in an atmosphere containing hydrogen. The purpose was to seal surface pores. In addition to this annealing, small Si atoms may be added by a source gas or the like to compensate for atoms for surface pore sealing.

A resultant member can be handled as a wafer that is identical to a normal epitaxial wafer. Only a different point is that the porous Si layer is formed under the epitaxial layer. A circuit such as a microprocessor, logic IC, or memory was formed on the epitaxial layer. With the same processes as in normal manufacturing, an LSI having performance identical to a conventional LSI could be formed. Before formation of a device on the epitaxial layer, it is also preferable to anneal the epitaxial layer in a hydrogen atmosphere.

A Si region of the porous Si layer is depleted and has a high resistance. With this structure, high-speed operation and low power consumption of a device can be realized as if an SOI were used.

When a trench is used for element isolation, the chip area can be reduced, and the number of chips available from a wafer increases. When a trench or LOCOS reached the porous Si layer, insulation between elements could be achieved as well as the high resistance of the porous Si layer.

To divide the wafer into a plurality of chips, dicing was executed from the device formation layer side to form kerfs. The bottom surface of each kerf was located in the porous Si layer.

Water as a fluid was injected to the kerfs. The fluid jet was injected to two kerfs around a chip. Thus, the chip was separated from the member. If neighboring chips were already been separated, the chip could be separated only by a fluid injected from one nozzle.

As a fluid, for example, a gas, a liquid, or a gas or liquid containing solid granules or powder can be used. In Example 1, water jet (to be referred to as "WJ" hereinafter) is used. Alternatively, air jet, nitrogen gas jet or another gas jet, liquid jet except water, liquid jet containing ice or plastic pieces or abrasives, or a static pressure thereof may be applied. As a characteristic feature of a fluid, it can enter a very small gap to increase the internal pressure and also distribute the external pressure. As another characteristic feature, since no excessive pressure is partially applied, a portion that is most readily separated can be selectively separated.

In separation, a chip surface is preferably supported by a support member or the like. Porous Si remaining on the device layer side may be removed or not.

After that, each chip was packaged. Wire bonding may be done from the upper surface side while placing the separated surface on a package. Alternatively, a chip may be packaged with its upper surface facing down. When a chip is directly packaged on a plastic card, an IC card can be formed.

When the package is used as a heat sink, the heat dissipation properties can be greatly improved as compared to a conventional back grinder scheme. Generally, the thickness of the wafer that can be achieved by back-grinding the back surface of the wafer using the back grinder is to a several hundred $\mu$m. In the present invention, the total thickness of the surface epitaxial layer and porous Si remaining portion is only about 10 $\mu$m or less. For this reason, the distance between the heat generation source of the device and the heat sink decreases, and the heat dissipation properties greatly improve. OEIC (OptoElectronic Integrated Circuits) may be formed on the epitaxial layer, and the chip may be packaged on a transparent substrate or optical waveguide.

The single-crystal Si substrate that remained after separation could be re-used in the same process after surface re-polishing or etching was executed as needed. The substrate may be used for another purpose.

EXAMPLE 2

In Example 1, a single porous layer was used. In Example 2, two porous layers having different porosities were formed.

First, the surface of a silicon substrate was anodized under the following conditions.

Current density: 8 ($mA.cm^{-2}$
Anodizing solution:$HF:H_2O:C_2H_5OH=1:1:1$
Time: 5 (min)
Thickness of porous Si layer: 6 ($\mu$m)

Then, anodizing was executed under the following conditions.

Current density: 33 ($mA.cm^{-2}$)
Anodizing solution:$HF:H_2O:C_2H_5OH=1:1:1$
Time: 80 (sec)
Thickness of porous Si layer: 3 ($\mu$m)

With these processes, a high-porosity layer having a porosity of 45% and a low-porosity layer having a porosity of 20% were formed from the single-crystal silicon substrate side. After that, an epitaxial silicon layer was formed on the low-porosity layer under the same conditions as in Example 1, and an integrated circuit and the like were formed. To form chips, dicing was executed from the epitaxial layer side. The bottom surface of each kerf was controlled to be located near the interface between the high-porosity layer and the low-porosity layer. Water was injected to the kerfs to separate a chip. Separation occurred near interface between the above-described two porous layers. The remaining conditions were the same as in Example 1.

The thicknesses of the two porous layers need not always be 6 $\mu$m/3 $\mu$m. The thicknesses can be changed by changing the anodizing conditions. The anodizing solution need not always be $HF:H_2O$: $C_2H_5OH=1:1:1$. Instead of ethanol, another alcohol such as IPA (isopropyl alcohol) may be used. An alcohol serving as a surfactant aims at preventing reactive bubbles from sticking to a wafer surface. Hence, a surfactant other than an alcohol may be used. Alternatively, surface sticking bubbles may be removed by an ultrasonic wave without adding any surfactant.

A device layer such as an integrated circuit may be formed after kerf formation.

EXAMPLE 3

A p-type single-crystal Si substrate having a resistivity of 14 $\Omega$.cm was prepared. The plane orientation was <100>. A circuit formation layer for a microprocessor, logic IC, memory, or the like was formed on the surface of the single-crystal Si substrate.

Hydrogen ions were implanted from the circuit formation layer side to a predetermined depth (in Example 3, a depth of 0.5 µm from the surface side), thereby forming an ion-implanted layer. The dose was several $10^{16}$ to $10^{17}/cm^2$. Before implantation, a protective film of $SiO_2$ may be formed on the uppermost surface.

Next, dicing was performed to form kerfs that partition the substrate into desired regions. The bottom surface of each kerf was located in the ion-implanted layer. After that, when wafer jet was injected from the kerfs, the wafer was separated into a plurality of chips.

Instead of injecting water jet to the kerfs, a region to be separated into a chip may be locally heated by a laser. Kerfs may be formed before formation of an ion-implanted layer.

When the separation layer is formed by ion implantation, microcavities formed by ion implantation are coagulated and separated at 400° C. to 600° C. It is therefore normally difficult to form an integrated circuit that requires a process temperature of about 800° C. or more. However, this problem can be solved by forming a device layer before formation of an ion-implanted layer, as in Example 3.

EXAMPLE 4

A p-type single-crystal Si substrate having a resistivity of 0.01 Ω.cm was prepared. The substrate surface was anodized in an HF solution. The anodizing conditions were Current density: 8 ($mA.cm^{-2}$)
Anodizing solution:$HF:H_2O:C_2H_5OH=1:1:1$
Time: 5 (min)
Thickness of porous Si layer: 6 (µm)

Then, anodizing was executed under the following conditions.

Current density: 33 ($mA.cm^{-2}$)
Anodizing solution:$HF:H_2O:C_2H_5OH=1:1:1$
Time: 80 (sec)
Thickness of porous Si layer: 3 (µm)

A high-porosity layer having a porosity of 45% and a low-porosity layer having a porosity of 20% were formed from the single-crystal silicon substrate side. After that, an epitaxial silicon layer was formed on the low-porosity layer under the same conditions as in Example 1, and an integrated circuit and the like were formed. To form chips, dicing was executed from the epitaxial layer side to partition the wafer into small regions. The bottom surface of each kerf was controlled to be located near the interface between the high-porosity layer and the low-porosity layer.

Next, a desired region to be separated into a chip was separated by an external force (tensile force in Example 4) while holding that region by a holding tool such as vacuum holders (tweezers).

For separation, various external forces may be combined. For example, a chip may be separated by a tensile force after application of a compression force. Alternatively, an external force and a fluid may be combined for separation.

According to the present invention, a thin-film semiconductor device can be manufactured by a smaller number of processes with reduced influence on a device formation layer at the time of separation.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing a thin-film semiconductor device, comprising:

a step of preparing a member having, on a separation layer, a semiconductor film having a semiconductor element and/or semiconductor integrated circuit;

a step of forming kerfs from the semiconductor film side of the member; and a separation step of, after the kerf formation step, forming cracks in the separation layer to separate a desired region of the semiconductor element and/or semiconductor integrated circuit from the member, wherein the separation step is performed by utilizing a pressure of a fluid.

2. The method according to claim 1, wherein the separation step is performed by injecting the fluid into the kerfs.

3. The method according to claim 1, wherein the member is obtained by forming a porous layer on a surface of a semiconductor substrate, forming the semiconductor film on a surface of the porous layer, and then forming the semiconductor element and/or semiconductor integrated circuit.

4. The method according to claim 1, wherein the member is obtained by forming a porous layer on a surface of a semiconductor substrate, forming a protective film on inner walls of pores in the porous layer, forming the semiconductor film on a surface of the porous layer, and then forming the semiconductor element and/or semiconductor circuit.

5. The method according to claim 3, wherein the semiconductor substrate is a single-crystal silicon substrate or a compound semiconductor substrate.

6. The method according to claim 1, wherein the kerfs are formed in the semiconductor film.

7. The method according to claim 1, wherein the kerfs are formed in a region formed in a process of forming the semiconductor element and/or semiconductor integrated circuit on the semiconductor film.

8. The method according to claim 1, wherein the kerfs are formed by one of dicing, etching, laser abrasion, ultrasonic cutter, and high-pressure jet.

9. The method according to claim 1, wherein the kerfs are formed such that bottom portions thereof are located in the separation layer or at an interface between the semiconductor film and the separation layer.

10. The method according to claim 1, wherein the member has the separation layer and semiconductor film on a semiconductor region, and the kerfs are formed such that bottom portions thereof are located at an interface between the separation layer and the semiconductor region or in the semiconductor region.

11. The method according to claim 2, wherein the separation step is performed by injecting a high-pressure fluid from the kerfs.

12. The method according to claim 2, wherein the separation step is performed by injecting the fluid comprising a liquid or a gas to at least some of the kerfs.

13. The method according to claim 12, wherein the separation step is performed by injecting the fluid from at least two of the kerfs around the desired region.

14. The method according to claim 1, wherein the separation step is performed under a static pressure.

15. The method according to claim 1, wherein the desired region is formed into a chip by the separation step.

16. The method according to claim 1, wherein the desired region is formed into a plurality of chips by the separation step.

17. The method according to claim 1, wherein the member is formed again using a remaining member that is left after the desired region is separated from the member.

18. A method of manufacturing a thin-film semiconductor device, comprising:
- a step of preparing a member having, on a separation layer, a semiconductor film having a semiconductor element and/or semiconductor integrated circuit;
- a step of forming kerfs from the semiconductor film side of the member; and
- a separation step of, after the kerf formation step, forming cracks in the separation layer to separate a desired region of the semiconductor element and/or semiconductor integrated circuit from the member,
- wherein the member is obtained by forming the semiconductor element and/or semiconductor integrated circuit on a surface of a semiconductor substrate and implanting ions from the surface side to a predetermined depth to form the separation layer.

19. The method according to claim 18, wherein the semiconductor substrate is a single-crystal silicon substrate or a compound semiconductor substrate.

* * * * *

UNITED STATES PATENT AND TRADEMARK OFFICE
CERTIFICATE OF CORRECTION

PATENT NO. : 6,677,183 B2
APPLICATION NO. : 10/059116
DATED : January 13, 2004
INVENTOR(S) : Kiyofumi Sakaguchi et al.

It is certified that error appears in the above-identified patent and that said Letters Patent is hereby corrected as shown below:

ON THE COVER PAGE:
Item 56 references cited, "Sauaguchi et al." should read --Sakaguchi et al.--.

COLUMN 6:
Line 48, "(mA . cm$^{-2}$)" should read --(mA · cm$^{-2}$)--.

COLUMN 8:
Line 28, "(mA . cm$^{-2}$" should read --(mA · cm$^{-2}$)--; and
Line 35, "(mA . cm$^{-2}$" should read --mA · cm$^{-2}$)--.

COLUMN 9:
Line 30, "(mA . cm$^{-2}$)" should read --(mA · cm$^{-2}$)--.

Signed and Sealed this

Twenty-ninth Day of August, 2006

JON W. DUDAS
*Director of the United States Patent and Trademark Office*